US009881757B2

(12) United States Patent
Hwang et al.

(10) Patent No.: US 9,881,757 B2
(45) Date of Patent: Jan. 30, 2018

(54) ELECTRONIC HOME APPLIANCE AND CONTROL METHOD THEREOF

(71) Applicant: LG ELECTRONICS INC., Seoul (KR)

(72) Inventors: Kyungeun Hwang, Seoul (KR); Soyeon Ko, Seoul (KR); Youjin Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 474 days.

(21) Appl. No.: 14/593,017

(22) Filed: Jan. 9, 2015

(65) Prior Publication Data
US 2015/0194283 A1 Jul. 9, 2015

(30) Foreign Application Priority Data

Jan. 9, 2014 (KR) ........................ 10-2014-0003023

(51) Int. Cl.
| | |
|---|---|
| *B23K 11/24* | (2006.01) |
| *H02B 1/24* | (2006.01) |
| *H01H 47/00* | (2006.01) |
| *H03K 17/96* | (2006.01) |
| *D06F 39/00* | (2006.01) |

(52) U.S. Cl.
CPC ......... *H01H 47/001* (2013.01); *D06F 39/005* (2013.01); *H03K 17/96* (2013.01); *H01H 2231/012* (2013.01); *Y10T 307/766* (2015.04)

(58) Field of Classification Search
USPC ................................................ 307/112, 116
See application file for complete search history.

(56) References Cited

U.S. PATENT DOCUMENTS

| | | | | |
|---|---|---|---|---|
| 2004/0226424 | A1* | 11/2004 | O'Banion | B23D 47/08 83/397 |
| 2012/0327201 | A1 | 12/2012 | Kappler | |
| 2014/0119825 | A1* | 5/2014 | Castro | E01F 13/12 404/6 |
| 2014/0311880 | A1* | 10/2014 | Krumpelman | H01H 13/14 200/5 A |

(Continued)

FOREIGN PATENT DOCUMENTS

| | | |
|---|---|---|
| CN | 1675600 | 9/2005 |
| DE | 10 236937 A1 | 2/2004 |

(Continued)

OTHER PUBLICATIONS

European Search Report dated May 12, 2015 for European Application No. 15150517.9, 8 Pages.

(Continued)

*Primary Examiner* — Adam Houston
(74) *Attorney, Agent, or Firm* — Fish & Richardson P.C.

(57) ABSTRACT

An electric home appliance includes a sensing unit for sensing whether a user's body is within a predetermined range from the electric home appliance, an input unit configured to receive user input, and a controller configured to cause the input unit to be in a protruded state or a retreated state based on a sensing result of the sensing unit. The input unit is configured to move between the protruded state in which the input unit at least partially protrudes from the electric home appliance and the retreated state in which the input unit at least partially retreats into the electric home appliance.

15 Claims, 8 Drawing Sheets

(56) References Cited

U.S. PATENT DOCUMENTS

| | | | | |
|---|---|---|---|---|
| 2016/0023706 A1* | 1/2016 | Chang | ............... | B62J 25/00 |
| | | | | 180/90.6 |
| 2016/0263762 A1* | 9/2016 | Ramaswamy | ......... | B26D 5/005 |
| 2016/0263769 A1* | 9/2016 | Laliberte | ............... | B27G 19/02 |
| 2016/0265763 A1* | 9/2016 | Laliberte | ............... | B27G 19/02 |
| 2017/0036872 A1* | 2/2017 | Wallace | ............... | B60P 1/003 |
| 2017/0130509 A1* | 5/2017 | Sugiura | ............... | E05F 15/73 |

FOREIGN PATENT DOCUMENTS

| | | |
|---|---|---|
| DE | 10 2009003120 A1 | 11/2010 |
| EP | 1 795 642 A1 | 6/2007 |
| WO | WO 2004/019145 A1 | 3/2004 |
| WO | WO 2011/128745 A2 | 10/2011 |

OTHER PUBLICATIONS

Office Action issued in Chinese Application No. 201510013044.2 dated Jun. 20, 2016, 10 pages (with English translation).

\* cited by examiner (a)

(b)

ELECTRONIC HOME APPLIANCE AND CONTROL METHOD THEREOF

CROSS-REFERENCE TO RELATED APPLICATION

This application claims the priority benefit of Korean Patent Application No. 10-2014-0003023, filed on Jan. 9, 2014, in the Korean Intellectual Property Office, the disclosure of which is incorporated herein by reference.

TECHNICAL FIELD

The present application relates to an electric home appliance and a control method thereof.

BACKGROUND

In general, an electric home appliance can include an air conditioner for conditioning indoor air, a laundry treatment apparatus for treating laundry, or a refrigerator for storing food. For example, the laundry treatment apparatus may include a washing machine, a drying machine, and a washing and drying machine.

The washing machine is an apparatus that can perform a series of processes including washing, rinsing, and spin-drying to remove contaminants from laundry, such as clothing and bedding, using water, detergent, and mechanical actions. The washing machine may be classified as a top load type washing machine configured such that a drum, in which laundry is placed, is rotated about a vertical shaft or a front load type washing machine configured such that a drum, in which laundry is placed, is rotated about a horizontal shaft.

The drying machine is an apparatus that can apply hot air to laundry, such as clothing, to dry the laundry. Specifically, laundry is introduced into a drum, and hot air or cold air is supplied into the drum during rotation of the drum to dry the laundry.

The washing and drying machine is an apparatus having both a washing function and a drying function. Specifically, laundry is introduced into a drum, and a desired function is executed during rotation of the drum to wash or dry the laundry.

The electric home appliance, such as the laundry treatment apparatus, can enable a command for operating the electric home appliance to be input using various methods and through various structures. In the busy life of today, therefore, being able to easily and conveniently input a command to the electric home appliance can be an important consideration.

SUMMARY

It is an object of the present application to provide an electric home appliance including an input unit that can be protruded or retreated based on a location of a user and a control method thereof.

According to one aspect, an electric home appliance includes a sensing unit for sensing whether a user's body is within a predetermined range from the electric home appliance, an input unit configured to receive user input, and a controller. The input unit is configured to move between a protruded state in which the input unit at least partially protrudes from the electric home appliance and a retreated state in which the input unit at least partially retreats into the electric home appliance. The controller is configured to cause the input unit to be in the protruded state or the retreated state based on a sensing result of the sensing unit.

Implementations of this aspect may include one or more of the following features. For example, the electric home appliance may further include an output unit configured to display an optical pattern, wherein the controller is configured to determine whether to output the optical pattern based on a sensing result of the sensing unit. The input unit may be a dial that is configured to be rotated by the user, and the output unit may be disposed at a front of the dial. The front of the dial may be circular, and the output unit may be configured to display an optical pattern that revolves around an edge of the front of the dial. The sensing unit may be configured to sense a distance between the user's body and the electric home appliance, and the controller may be configured to determine a revolving speed of the optical pattern based on the distance sensed by the sensing unit. The sensing unit may be configured to sense a distance between the user's body and the electric home appliance, and the controller may be configured to determine a change speed of the optical pattern based on the distance sensed by the sensing unit.

Further according to this aspect, the sensing unit may be configured to sense a distance between the user's body and the electric home appliance, and the controller may be configured to determine whether to cause the input unit to be in the protruded state or the retreated state based on the distance sensed by the sensing unit. The controller may be configured to determine, from among a plurality of predetermined distance ranges, a distance range that corresponds to the sensed distance between the user's body and the electric home appliance and determine whether to cause the input unit to be in the protruded state or the retreated state based on the determined distance range. The controller may be configured to determine whether the input unit is touched or pushed based upon determining that the sensing unit is in an abnormal state. The controller may be configured to cause the input unit to be in the protruded state based upon determining that the input unit is touched or pushed.

According to another aspect, a control method of an electric home appliance includes sensing, via a sensing unit, whether a user's body is within a predetermined range from the electric home appliance, calculating a distance between the user's body and the electric home appliance, and causing an input unit configured to receive user input to be in a protruded state or a retreated state based on presence or absence of the user's body within the predetermined range and the calculated distance.

Implementations of this aspect may include one or more of the following features. For example, the control method may further include outputting an optical pattern based on presence or absence of the user's body within the predetermined range. The input unit may be a dial rotatable by the user, the optical pattern may revolve around an edge of a front of the dial, and the control method may further include determining a change speed of the optical pattern based on the calculated distance. Causing the input unit to be in the protruded state or the retreated stated may include determining, from among a plurality of predetermined distance ranges, a distance range that corresponds to the calculated distance and determining whether to protrude or retreat the input unit based on the determined distance range. The input unit may be a dial rotatable by the user, the optical pattern may revolve around an edge of a front of the dial, and the control method may further include determining a revolving speed of the optical pattern based on the calculated distance. The control method may further include determining whether the input unit is touched or pushed based on the sensing unit being in an abnormal state. The control method may further include causing the input unit to be in the protruded state based upon determining that the input unit was touched or pushed.

BRIEF DESCRIPTION OF THE DRAWINGS

The above and other objects, features and other advantages of the present application will be more clearly understood from the following detailed description taken in conjunction with the accompanying drawings, in which.

DETAILED DESCRIPTION

Advantages and features of the present application and a method of achieving the same will be more clearly understood from implementations described below with reference to the accompanying drawings. However, the present application is not limited to the following implementations but may be implemented in various different forms. The implementations are provided merely to complete disclosure of the present application and to fully provide a person having ordinary skill in the art to which the present application pertains with the category of the application. The application is defined only by the category of the claims. Wherever possible, the same reference numbers will be used throughout the specification to refer to the same or like parts.

Terms used in the description of the application are provided only to explain specific implementations but are not intended to restrict the application. In the description of the application and the accompanying claims, the singular forms are intended to include the plural forms as well, unless context clearly indicates otherwise. The use of marks may indicate any one or both of the singular forms and the plural forms of the terms, and vice versa.

It will be understood that the term "and/or" refers to one or more possible combinations of specified relevant items and includes such combinations. It will be further understood that the terms "comprises" or "comprising" used in this specification designate presence of specified features, integers, steps, operations, elements, and/or components but do not exclude presence or addition of one or more other features, integers, steps, operations, elements, components, and/or groups thereof.

Hereinafter, implementations of computing devices, user interfaces for the computing devices, and related processes necessary to use the computing device may be described.

Reference will now be made in detail to the preferred implementations of the present application, examples of which are illustrated in the accompanying drawings. Hereinafter, a washing machine, which is one example of an electric home appliance, will be described by way of example. However, the present application is not limited thereto. For example, the idea of the present application may be applied to other laundry treatment apparatuses, such as a drying machine, an air conditioner, and a refrigerator.

Figure 1:
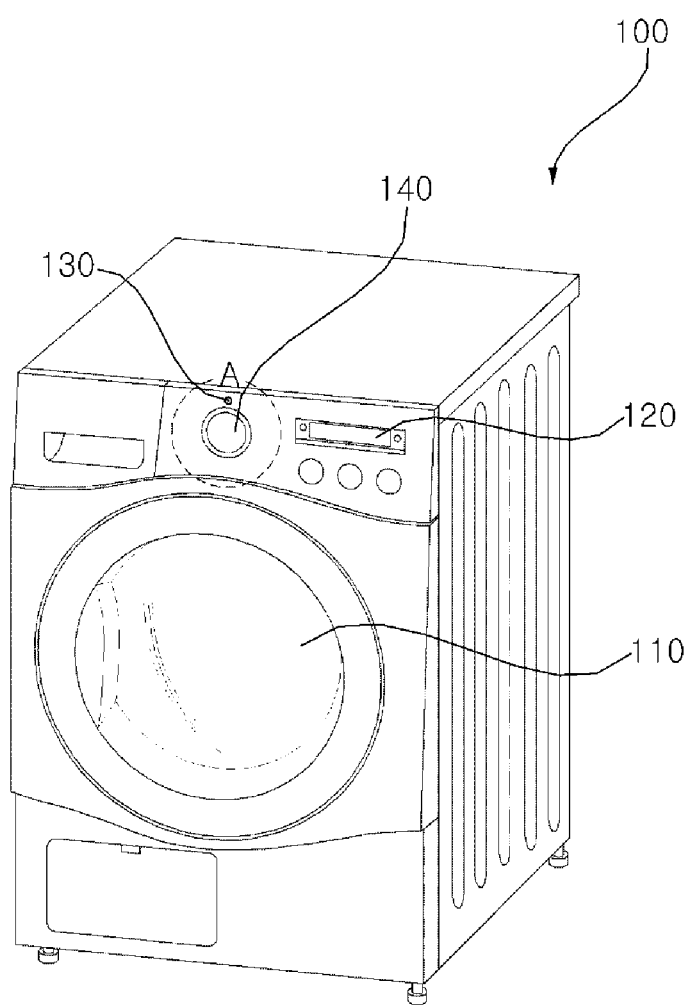
FIG. 1 is a perspective view showing an example washing machine according to an implementation of the present application.

Referring to FIG. 1, a washing machine 100 according to an implementation of the present application may include a case forming the external appearance of the washing machine and a drum rotatably provided in the case for receiving laundry, such as clothing. The drum may be provided at an internal circumferential surface thereof with a plurality of lifters for lifting clothing upward and dropping the clothing downward when the drum is rotated.

The case may be provided at the front thereof with a clothing introduction port, which can be opened such that clothing may be introduced into the drum through the clothing introduction port. The case may be provided at the upper side of the front thereof with a display unit 120 for displaying control information of the washing machine. The display unit 120 may include a light source, such as a liquid crystal display (LCD) or a light emitting diode (LED), for displaying control information of the washing machine. However, the present application is not limited thereto.

The case, which forms the external appearance of the washing machine, may recognize an external touch. For example, the case may sense an external touch. Upon sensing the external touch, the case may signalize the sensed touch and transmit the signalized touch to a controller.

A door 110 may be mounted at the clothing introduction port. The door 110 may open and close the clothing introduction port, which is an entrance through which clothing is introduced into the drum. The door 110 may be manually manipulated by a user or operated according to electronic control. The door 110 may be hingedly connected to the case.

The display unit 120 may display various kinds of information. For example, the display unit 120 may display an operation mode, an operation time, or weather information. However, the present application is not limited thereto.

The washing machine 100 may include a sensing unit 130 for sensing whether an object is in front of the washing machine 100. The sensing unit 130 may sense whether an object is within a predetermined distance from the washing machine 100. For example, the sensing unit 130 may sense whether a human body is within a predetermined range. The sensing unit 130 may be disposed at the upper part of the middle of the case. However, the present application is not limited thereto. For example, the sensing unit 130 may be disposed at the upper end of the right side or the left side of the case depending upon the type of a sensor included in the sensing unit 130.

An input unit 140 may be disposed at the front of the washing machine 100. The input unit 140 may be protruded from a surface of the washing machine 100 or may be retreated into the surface. For example, the input unit 140 may be disposed at the front of the case in a state in which the input unit 140 is received in the case and, when a user approaches the washing machine, may be protruded outward from the case. In some cases, the input unit 140 in its retreated state may be generally flush with the washing machine surface.

In some cases, the input unit 140 may be configured in the form of a rotary dial. The input unit 140 may be disposed in the case of the washing machine and may protrude outward from the case depending upon location of the user.

The input unit 140 may be circular at the front thereof. An output unit for displaying an optical pattern may be disposed at the front of the input unit 140. When the input unit 140 protrudes and retreats, the output unit may change the optical pattern based on the operation of the input unit 140.

Figure 2:
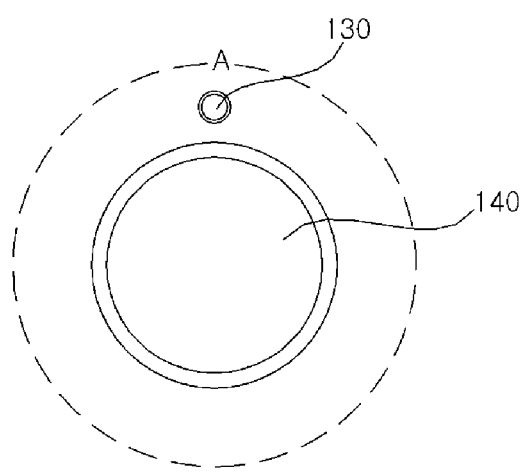
FIG. 2 is a view showing an example operation of an input unit of washing machine.
Figure 2:
Figure 2:
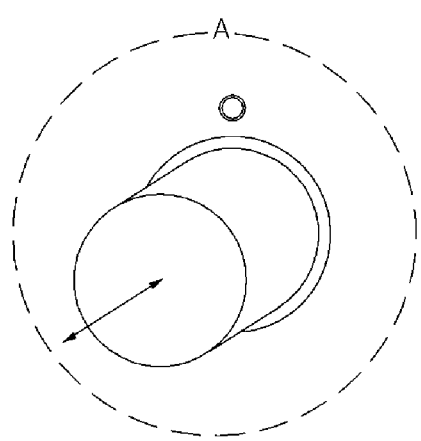

FIG. 2 is an enlarged view showing part A of FIG. 1.

Referring to FIG. 2, the electric home appliance according to the implementation of the present application may include the input unit 140, which is configured to be protruded or retreated.

The input unit 140 may be a rotary dial. For example, the input unit 140 may be configured in a cylindrical form. The input unit 140 may be protruded from the case or retreated into the case. The input unit 140 may be inserted into the case such that the front of the input case may be located on the same plane as the case. The input unit 140 may advance such that the front of the input unit 140 can protrude more forward than the case.

The input unit 140 may be protruded when the user approaches the washing machine and may return to the original position thereof when the user moves away from the washing machine. The input unit 140 may be rotated according to manipulation of the user. The input unit 140 may decide an input value based on a rotation degree of the input unit 140.

Figure 3:
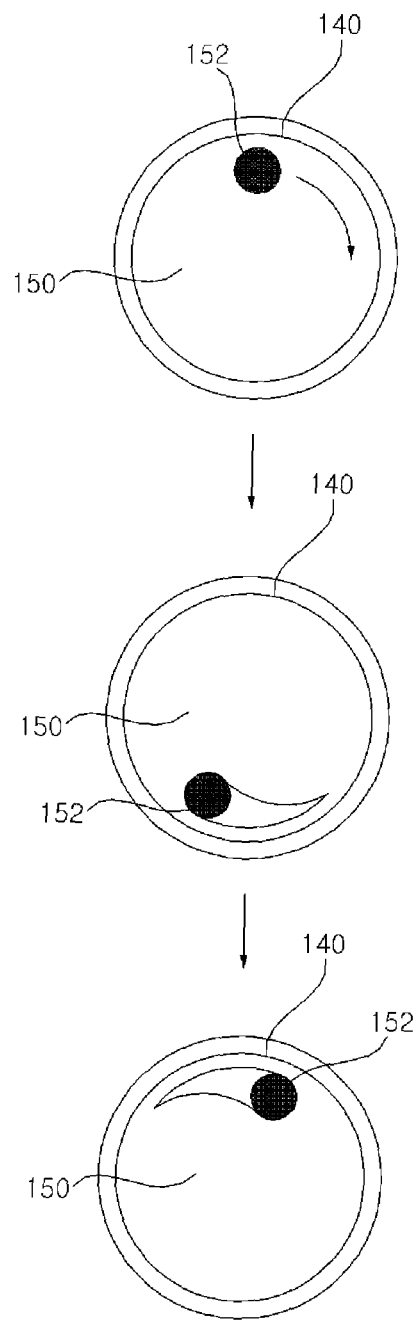
FIG. 3 is a view showing an example optical pattern display mode of an output unit of the washing machine.

FIG. 3 illustrates an optical pattern display mode of the output unit of the electric home appliance according to the implementation of the present application.

Referring to FIG. 3, the input unit 140 may be circular at the front thereof. However, the present application is not limited thereto. The front of the input unit 140 may be configured in various forms.

An output unit 150 for displaying an optical pattern may be disposed at the front of the input unit 140. The front of the output unit 150 may be configured in the same form as that of the input unit 140.

The output unit 150 may display various optical patterns. For example, the output unit 150 may display an optical pattern 152 revolving around an edge of the output unit 150. The output unit 150 may display an optical pattern 152 rotating while being spaced apart from the center of the output unit 150 by a predetermined distance. However, the present application is not limited thereto.

Figure 4:
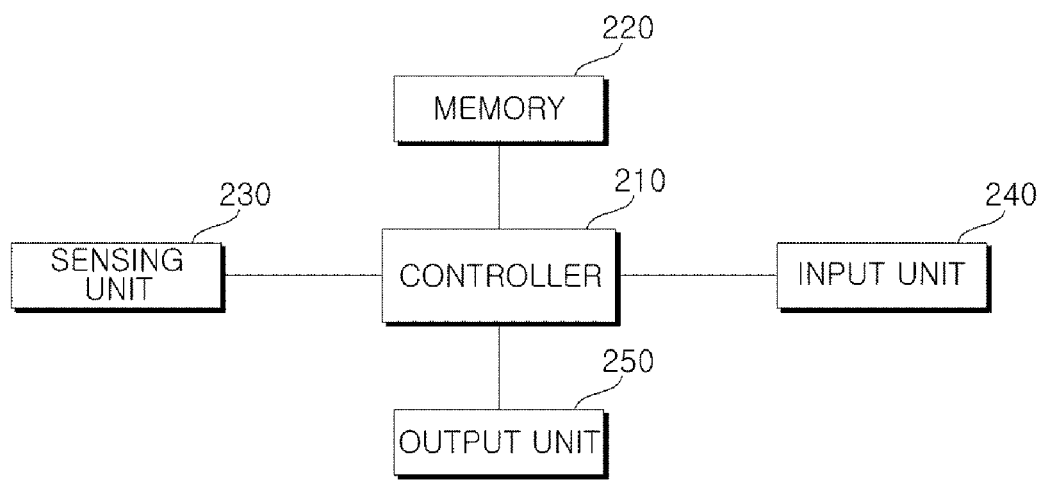
FIG. 4 is a block diagram showing components of an example electric home appliance according to another implementation of the present application.

FIG. 4 illustrates a block diagram of components of an electric home appliance according to another implementation of the present application.

Referring to FIG. 4, the electric home appliance according to the implementation of the present application may include a sensing unit 230 for sensing whether a human body is within a predetermined range, an input unit 240 configured to be protruded or retreated based on a result sensed by the sensing unit 230, the input unit 240 for allowing a user's input, and a controller 210 for deciding whether to protrude or retreat the input unit 240 based on presence or absence of the human body sensed by the sensing unit 230.

The controller 210 may control operation of the electric home appliance. The controller 210 may transmit and receive a control signal to and from the other components of the electric home appliance. The controller 210 may transmit a signal to each component of the electric home appliance to control each component.

The controller 210 may display data stored in a memory 220 through the display unit or execute a program stored in the memory 220 to process the data.

The controller 210 may recognize motion of an object around the electric home appliance based on an output of the sensing unit 230. The controller 210 may determine whether a human body is within a predetermined distance from the electric home appliance. The controller 210 may recognize a time during which the human body stays within the predetermined distance from the electric home appliance.

The controller 210 may decide whether to protrude or retreat the input unit 240 based on presence or absence of the human body sensed by the sensing unit 230. In a case in which the human body stays within a predetermined range for a predetermined time or more, the controller 210 may determine whether to protrude the input unit 240. For example, in a case in which the human body stays within the predetermined range for 10 seconds or more, the controller 210 may determine whether to protrude the input unit 240. However, the present application is not limited thereto.

The controller 210 may recognize a distance from the human body. For example, the controller 210 may recognize a distance from the sensing unit 230 to the human body. The controller 210 may decide whether to protrude the input unit 240 based on the distance from the sensing unit 230 to the human body.

For example, in a case in which the human body stays within a predetermined range for a predetermined time or more and the distance from the human body is within a predetermined distance, the controller 210 may control the input unit 240 to protrude. However, the present application is not limited thereto.

The controller 210 may recognize a distance range, within which the distance from the human body is, among a plurality of predetermined distance ranges. In a case in which the distance from the human body is within one selected from among the predetermined distance ranges, the controller 210 may control the input unit 240 to protrude.

For example, the controller 210 may set a first distance range, a second distance range, and a third distance range that correspond to sequentially increasing distances. For example, in a case in which the distance from the human body is within the first distance range or the second distance range, the controller 210 may control the input unit 240 to be protruded while displaying an optical pattern. In another example, in a case in which the distance from the human body is within the third distance range, the controller 210 may control the input unit 240 not to be protruded while displaying the optical pattern. However, the present application is not limited thereto.

The controller 210 may decide whether to output the optical pattern based on presence or absence of the human body sensed by the sensing unit. For example, in a case in which the human body stays within a predetermined range for a predetermined time or more, the controller 210 may control an output unit 250 to output the optical pattern.

In a case in which the human body stays within the predetermined range for the predetermined time or more, the controller 210 may recognize a distance from the human body. The controller 210 may adjust a change speed of the optical pattern based on the distance from the human body. For example, as the distance from the human body decreases, the controller 210 may increase the change speed of the optical pattern. However, the present application is not limited thereto. For example, the optical pattern displayed by the output unit 250 may revolve about the center of the front of the input unit 240 in a circular shape.

The controller 210 may change a revolving speed of the optical pattern based on the distance from the human body. The controller 210 may adjust an output time of the optical pattern based on the distance from the human body. As the distance from the human body decreases, the controller 210 may decrease the output time of the optical pattern. However, the present application is not limited thereto.

In a case in which the human body deviates from the predetermined range, the controller 210 may control the input unit 240 to return to the original position thereof. In a case in which there is no input for a predetermined time or more after the input unit 240 protrudes, the controller 210 may control the input unit 240 to return to the original position thereof. For example, in a case in which the human body deviates from the predetermined range, the controller 210 may control the input unit 240 to return to the original position thereof and control the optical pattern not to be output. However, the present application is not limited thereto.

The controller 210 may determine whether the sensing unit 230 properly works. Upon sensing that the sensing unit 230 is in an abnormal state, that is not working properly, the controller 210 may determine whether the input unit 240 is touched. The controller 210 may determine that the input unit 240 is touched or pushed by the user.

In a case in which the sensing unit 230 does not properly work or in a case in which the input unit 240 is touched or pushed, the controller 210 may control the input unit 240 to protrude. However, the present application is not limited thereto.

Meanwhile, the controller 210 may be embodied using at least one selected from among application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and electrical units for performing other functions.

The memory 220 may include a high-speed random access memory. The memory 220 may include nonvolatile memories, such as one or more magnetic disc storage devices, flash memory devices, or other nonvolatile solid memory devices. However, the present application is not limited thereto. The memory 220 may include a readable storage medium.

For example, the memory 220 may include an electronically erasable and programmable read only memory (EEPROM). However, the present application is not limited thereto. Information may be written into the EEP-ROM or removed from the EEP-ROM under control of the controller 210. The EEP-ROM may be a storage device that retains information without removal of the information even when the electric home appliance is powered off and, therefore, power is not supplied to the EEP-ROM.

The memory 220 may be interlocked with the controller 210 to store various programs or data. Programs stored in the memory 220 may be executed by the controller 210.

The sensing unit 230 may be disposed at the front of the electric home appliance. The sensing unit 230 may sense whether an object is within a predetermined range. For example, the sensing unit 230 may include at least one selected from among a camera, a kinetic sensor, an infrared sensor, and an ultrasonic sensor. However, the present application is not limited thereto. The sensing unit 230 may include any sensor that is capable of sensing presence or absence of a human body.

The sensing unit 230 may sense whether an object is within a predetermined range and transmit information regarding presence or absence of the object to the controller 210. The sensing unit 230 may sense a distance from an object or a human body.

For example, the sensing unit 230 may include a stereo camera. In this case, the electric home appliance may include an image processor. The image processor may recognize a distance from an object or a human body based on stereo images acquired by the stereo camera. The image processor may be configured separately from the controller 210 and may be included in the sensing unit 230. Alternatively, the image processor may be modularized as a software component and may be included in the controller 210. In some cases, the sensing unit 230 may include a mono camera. In this case, the electric home appliance may include an image processor. The image processor may recognize a distance from an object or a human body based on the change in size of the object or the human body in images acquired by the mono camera. The image processor may be configured separately from the controller 210 and may be included in the sensing unit 230. Alternatively, the image processor may be modularized as a software component and may be included in the controller 210.

For example, in a case in which the sensing unit 230 includes an ultrasonic sensor, the sensing unit 230 may sense a distance from an object or a human body through a time difference between transmitted and received signals.

For example, the sensing unit 230 may include an infrared sensor and a camera. In this case, when an infrared laser beam is emitted to an object or a human body, an image sensor included in the camera may receive a reflected laser beam point to measure a distance per pixel. The sensing unit 230 may sense the distance from the object or the human body based on the measured distance per pixel.

In some cases, the kinetic sensor may include a depth sensor. The depth sensor may include an image sensor, such as a complementary metal-oxide-semiconductor (CMOS) sensor or a charge-coupled device (CCD) sensor, or an infrared laser beam projector. When an infrared laser beam is emitted to an object or a human body, the image sensor may receive a reflected laser beam point to measure a distance per pixel. The sensing unit 230 may sense the distance from the object or the human body based on the measured distance per pixel.

In a case in which the sensing unit 230 includes a camera, the sensing unit 230 may sense whether a human body gazes at the electric home appliance. Specifically, the camera may detect pupils of the human body. At this time, an image processor may detect the pupils using a circular detection template, a circular edge detection method, a Daugman's circular edge detection method, etc. Alternatively, the image processor may detect the pupils using Hough transform, Haar-like feature, Adaboost algorithm, etc. The image processor may be configured separately from the controller 210. Alternatively, the image processor may be functionally modularized and may be included in the controller 210.

The input unit 240 may allow a user's input. For example, the input unit 240 may be a dial that can be rotated by manipulation of a user. However, the present application is not limited thereto. For example, the input unit 240 may be a touch pad or a mechanical button.

The input unit 240 may be enabled or disabled by a command from the controller 210. The input unit 240 may be protruded or retreated by the command from the controller 210. When the user is near the electric home appliance, the input unit 240 may be protruded or enabled. When the user deviates from a predetermined range, the input unit 240 may return to the original position thereof or may be disabled.

The input unit 240 may further include a drive unit for providing mechanical driving force for protruding or retreating the input unit 240. For example, the drive unit may include an energy conversion unit, such as a motor or an actuator, for converting electric energy into dynamic energy. The drive unit may protrude the input unit 240 or return the input unit 240 to the original position thereof or may be disabled under control of the controller 210.

The output unit 250 may be a unit for displaying various kinds of information. The output unit 250 may include a display unit for displaying various kinds of information.

The output unit 250 may be disposed at the front of the input unit 240 for displaying an optical pattern. According to some implementations, in a case in which the input unit 240 includes a rotary dial, the output unit 250 may display a circular optical pattern surrounding the rotary dial. The output unit 250 may change an optical pattern display mode according to a command from the controller 210. The output unit 250 may change a change speed of the optical pattern according to the command from the controller 210.

In some cases, the output unit 250 may include an optical pattern display unit. The optical pattern display unit may display an optical pattern under control of the controller 210. The optical pattern display unit may be disposed at the front of the input unit 240. In a case in which the input unit 240 includes a rotary dial, the optical pattern display unit may be disposed in a circular form surrounding the rotary dial.

The output unit 250 may include at least one selected from among a light emitting polymer display (LPD), a liquid crystal display, a thin film transistor-liquid crystal display, an organic light-emitting diode, a flexible display, and a three-dimensional (3D) display. However, the present application is not limited thereto.

The output unit 250 may display information necessary to control the electric home appliance. For example, in a case in which the electric home appliance is a washing machine, the output unit 250 may display a washing mode, a washing time, etc. However, present application is not limited thereto. The output unit 250 may display all information necessary to control the washing machine.

Figure 5:
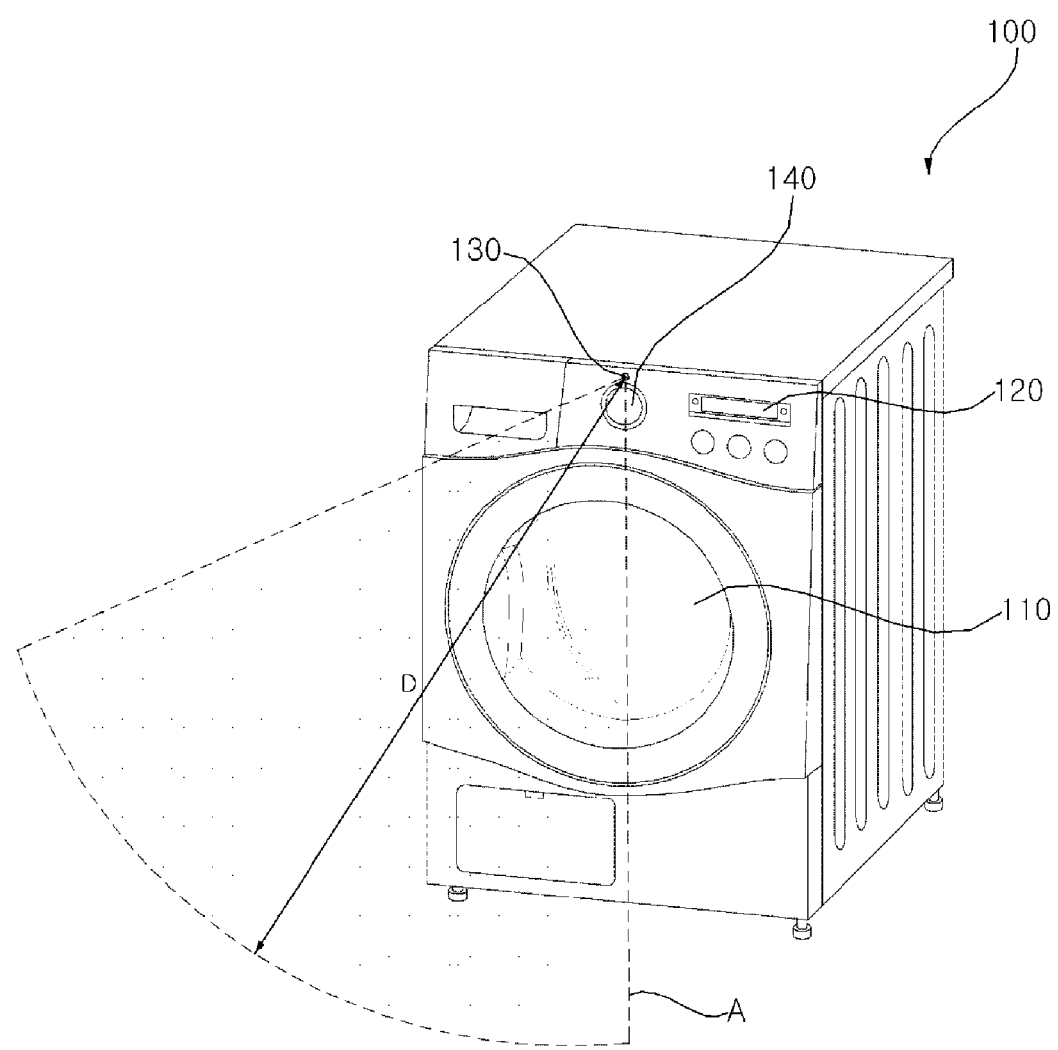
FIGS. 5 to 7 are schematic views showing an example control process of the electric home appliance.
Figure 6:
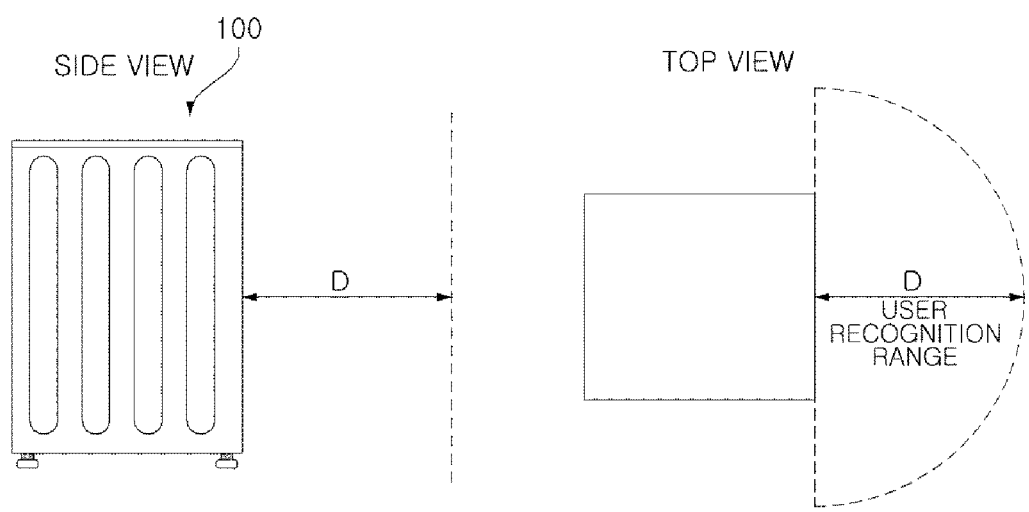

Referring to FIGS. 5 and 6, a washing machine, which is an example of the electric home appliance according to the implementation of the present application, may determine whether a human body is within a predetermined distance D in front of the washing machine.

The sensing unit 130 may sense whether the human body is within a predetermined range A including the predetermined distance D. Referring to FIG. 6, for example, a range within which the sensing unit 130 senses the human body may be semicircular when viewed from above the washing machine. In addition, the range within which the sensing unit 130 senses the human body may be parallel to the front of the washing machine when viewed from a side of the washing machine.

Figure 7:
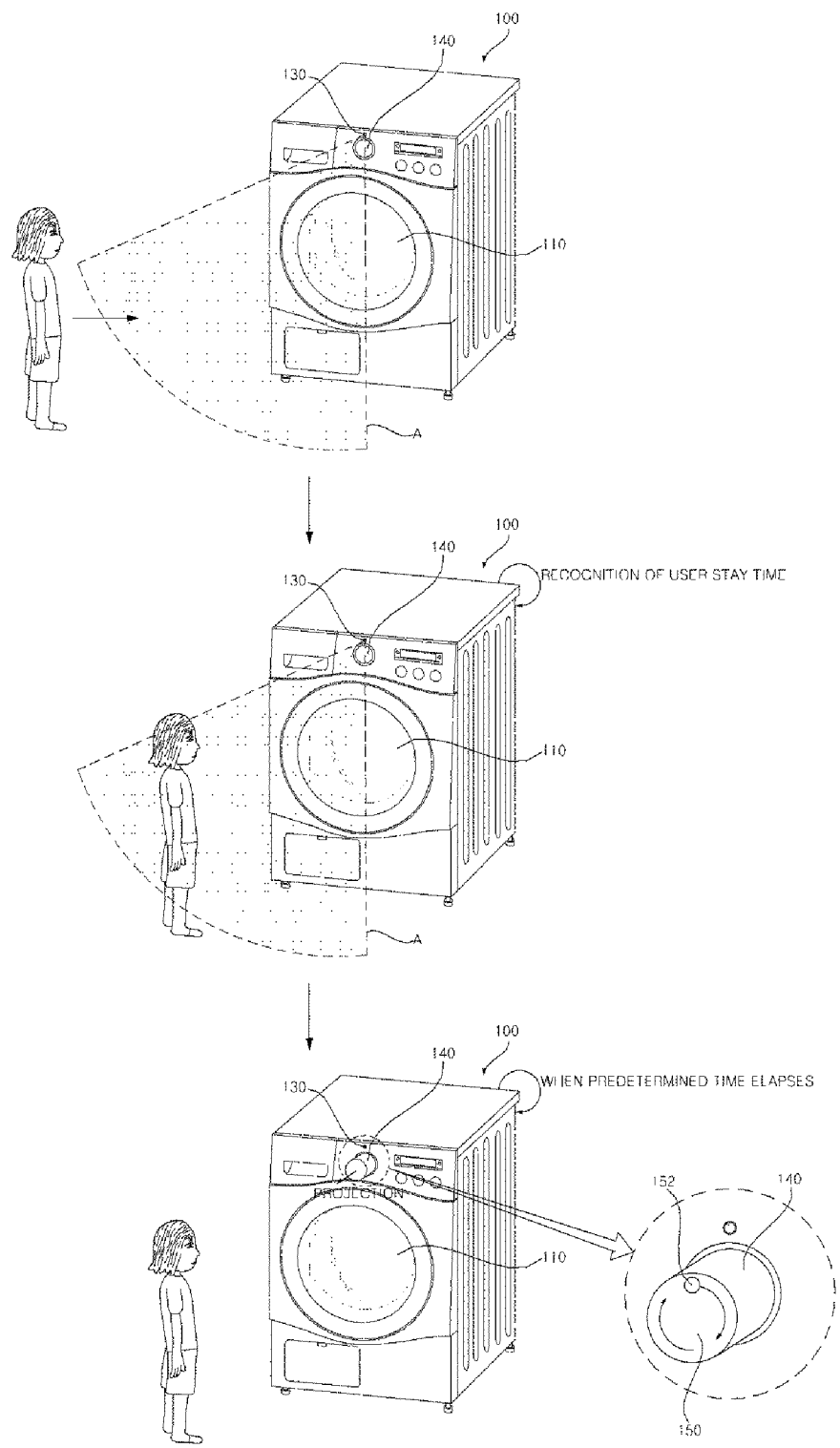

Referring to FIG. 7, the sensing unit 130 may sense whether the human body is within the predetermined range.

When the sensing unit 130 senses that the human body is within the predetermined range, the washing machine may recognize a time during which the human body stays within the predetermined range. In a case in which the human body stays within the predetermined range for a predetermined time or more, the washing machine may decide whether to protrude the input unit 140.

For example, in a case in which the human body stays within the predetermined range for the predetermined time or more and the distance from the human body is within the predetermined distance, the washing machine may protrude the input unit 140. For example, in a case in which the human body stays within the predetermined range for the predetermined time or more and the distance from the human body is within the predetermined distance, the washing machine may display an optical pattern. The washing machine may adjust a change speed of the optical pattern according to the distance from the human body.

Figure 8:
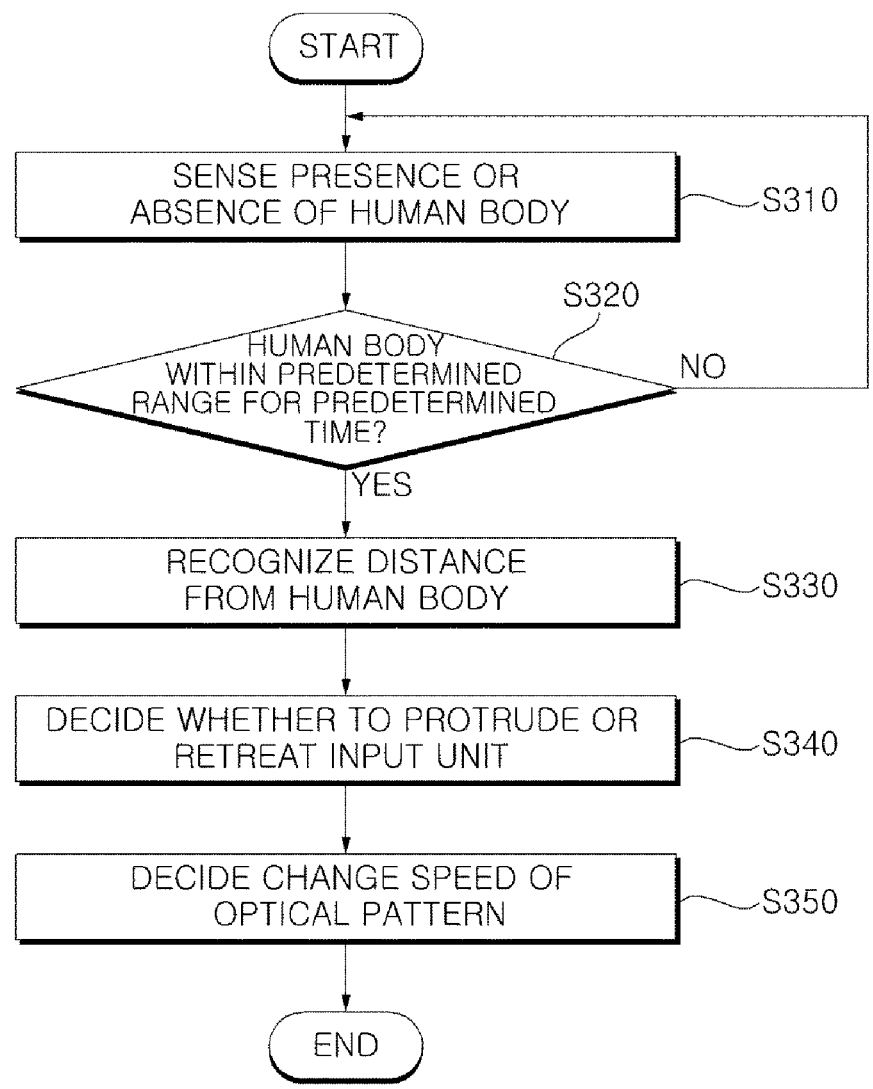
FIG. 8 is a flowchart showing an example control method of an electric home appliance according to yet another implementation of the present application.

FIG. 8 illustrates an example flowchart for a control method of an electric home appliance according to an implementation of the present application.

Referring to FIG. 8, the control method of the electric home appliance according to the implementation of the present application may include a step of sensing whether a human body is within a predetermined range (S310), a step of calculating a distance from the human body (S330), and a step of deciding whether to protrude or retreat the input unit for allowing a user's input based on presence or absence of the human body and the distance from the human body (S340).

The step of sensing whether the human body is within the predetermined range (S310) may sense motion of an object around the washing machine. The step of sensing whether the human body is within the predetermined range (S310) may sense whether the human body is within a predetermined distance from the electric home appliance. That is, the controller 210 may sense presence or absence of the human body through the sensing unit 230.

The control method of the electric home appliance according to the implementation of the present application may further include a step of recognizing a time during which the human body stays within the predetermined distance from the electric home appliance (S320) after the step of sensing whether the human body is within the predetermined range (S310). That is, the controller 210 may recognize a time during which the human body stays within the predetermined distance in a state in which presence of the human body is sensed (S320). The control method of the electric home appliance according to the implementation of the present application may further include a step of deciding whether to output an optical pattern. The electric home appliance may recognize the time during which the human body stays within the predetermined distance (S320) to decide whether to output the optical pattern. That is, the controller 210 may decide whether to output the optical pattern in response to the time during which the human body stays within the predetermined distance.

The step of calculating the distance from the human body (S330) may recognize the distance from the human body sensed by the sensing unit. That is, in a case in which the human body is within the predetermined range for the predetermined time, the controller 210 may recognize the distance from the human body (S330).

The step of deciding whether to protrude or retreat the input unit for allowing the user's input based on presence or absence of the human body and the distance from the human body (S340) may decide whether to protrude or retreat the input unit based on presence or absence of the human body. That is, the controller 210 may decide whether to protrude or retreat the input unit based on presence or absence of the human body and the distance from the human body (S340).

At the step of deciding whether to protrude or retreat the input unit for allowing the user's input based on presence or absence of the human body and the distance from the human body (S340), the controller 210 may determine whether to protrude the input unit in a case in which the human body stays within the predetermined range for the predetermined time or more.

At the step of deciding whether to protrude or retreat the input unit for allowing the user's input based on presence or absence of the human body and the distance from the human body (S340), the controller 210 may determine whether to protrude the input unit, for example, in a case in which the human body stays within the predetermined range for 10 seconds or more. However, the present application is not limited thereto.

At the step of deciding whether to protrude or retreat the input unit for allowing the user's input based on presence or absence of the human body and the distance from the human body (S340), the controller 210 may determine whether to protrude the input unit based on the distance from the human body.

At the step of deciding whether to protrude or retreat the input unit for allowing the user's input based on presence or absence of the human body and the distance from the human body (S340), the controller 210 may control the input unit to be protruded in a case in which the human body stays within the predetermined range for the predetermined time or more and the distance from the human body is within the predetermined distance. However, the present application is not limited thereto.

For example, at the step of deciding whether to protrude or retreat the input unit for allowing the user's input based on presence or absence of the human body and the distance from the human body (S340), the controller 210 may recognize approach of a user's hand.

At the step of deciding whether to protrude or retreat the input unit for allowing the user's input based on presence or absence of the human body and the distance from the human body (S340), the controller 210 may recognize a distance range, within which the distance from the human body is, among a plurality of predetermined distance ranges. At the step of deciding whether to protrude or retreat the input unit for allowing the user's input based on presence or absence of the human body and the distance from the human body (S340), the controller 210 may control the input unit to be protruded in a case in which the distance from the human body is within one selected from among the predetermined distance ranges.

The control method of the electric home appliance according to the implementation of the present application may further include a step of deciding a change speed of the optical pattern (S350).

At the step of deciding the change speed of the optical pattern (S350), the controller 210 may decide the change speed of the optical pattern based on the distance from the human body in a case in which human body stays within the predetermined range for the predetermined time or more.

At the step of deciding the change speed of the optical pattern (S350), the controller 210 may increase the change speed of the optical pattern as the distance from the human body decreases. However, the present application is not limited thereto. In a case in which the optical pattern output by the output unit revolves about the center of the front of the input unit in a circular shape, the controller may change a revolving speed of the optical pattern based on the distance from the human body at the step of deciding the change speed of the optical pattern (S350).

At the step of deciding the change speed of the optical pattern (S350), the controller 210 may adjust an output time of the optical pattern based on the distance from the human body. At the step of deciding the change speed of the optical pattern (S350), the controller 210 may decrease the output time of the optical pattern as the distance from the human body decreases. However, the present application is not limited thereto.

As is apparent from the above description, an electric home appliance and a control method thereof according to an implementation of the present application may have the following and other effects.

In the electric home appliance and the control method thereof according to the implementation of the present application, it is possible to decide whether to protrude or retreat the input unit based on location of a user, thereby minimizing power consumption due to unnecessary waiting.

In the electric home appliance and the control method thereof according to the implementation of the present application, it is possible to decide whether to output the optical pattern and whether to protrude or retreat the input unit based on a time during which the user is within a predetermined range, thereby recognizing that the user has an intention to use the electric home appliance.

In the electric home appliance and the control method thereof according to the implementation of the present application, it is possible to decide a change speed of the optical pattern and whether to protrude or retreat the input unit based on the distance from the user and, in addition, to change a corresponding speed based on the distance from the user such that the user can more rapidly input a command.

Although all elements constituting the implementations of the present application are described to be integrated into a single one or to be operated as a single one, the present application is not necessarily limited to such implementations. According to implementations, all of the elements may be selectively integrated into one or more and be operated as one or more within the object and the scope of the present application.

Each of the elements may be implemented as independent hardware. Alternatively, some or all of the elements may be selectively combined into a computer program having a program module performing some or all functions combined in one or more pieces of hardware.

A plurality of codes and code segments constituting the computer program may be easily reasoned by those skilled in the art to which the present application pertains. The computer program may be stored in a computer readable media such that the computer program is read and executed by a computer to implement implementations of the present application. Computer program storage media may include magnetic recording media, optical recording media, and carrier wave media.

The term "comprises", "includes", or "has" described herein should be interpreted not to exclude other elements but to further include such other elements since the corresponding elements may be inherent unless mentioned otherwise.

All terms including technical or scientific terms have the same meanings as generally understood by a person having ordinary skill in the art to which the present application pertains unless mentioned otherwise.

Generally used terms, such as terms defined in a dictionary, should be interpreted to coincide with meanings of the related art from the context. Unless obviously defined in the present application, such terms are not interpreted as ideal or excessively formal meanings.

Although the preferred implementations of the present application have been disclosed for illustrative purposes, those skilled in the art will appreciate that various modifications, additions and substitutions are possible without departing from the scope and spirit of the application as disclosed in the accompanying claims.

The implementations disclosed in the present application are provided not to limit the technical concept of the present application but to illustrate the technical concept of the present application. Therefore, the scope of the technical concept of the present application is not limited by such implementations. The scope of the protection of the present application should be determined by reasonable interpretation of the appended claims and all technical concepts coming within the equivalency range of the present application should be interpreted to be embraced in the scope of the right of the present application.

What is claimed is:

1. An electric home appliance comprising:
a sensing unit configured to sense whether a user's body is within a predetermined range from the electric home appliance;
an input unit configured to receive user input, the input unit being configured to move between a protruded state in which the input unit at least partially protrudes from the electric home appliance and a retreated state in which the input unit at least partially retreats into the electric home appliance;
an output unit configured to display an optical pattern; and
a controller configured to cause the input unit to be in the protruded state or the retreated state based on a sensing result of the sensing unit,
wherein the controller is configured to determine whether to output the optical pattern based on a sensing result of the sensing unit.

2. The electric home appliance according to claim 1, wherein
the input unit is a dial that is configured to be rotated by the user, and
the output unit is disposed at a front of the dial.

3. The electric home appliance according to claim 2, wherein
the front of the dial is circular, and
the output unit is configured to display an optical pattern that revolves around an edge of the front of the dial.

4. The electric home appliance according to claim 3, wherein
the sensing unit is configured to sense a distance between the user's body and the electric home appliance, and
the controller is configured to determine a revolving speed of the optical pattern based on the distance sensed by the sensing unit.

5. The electric home appliance according to claim 1, wherein
the sensing unit is configured to sense a distance between the user's body and the electric home appliance, and
the controller is configured to determine a change speed of the optical pattern based on the distance sensed by the sensing unit.

6. The electric home appliance according to claim 1, wherein
the sensing unit is configured to sense a distance between the user's body and the electric home appliance, and
the controller is configured to determine whether to cause the input unit to be in the protruded state or the retreated state based on the distance sensed by the sensing unit.

7. The electric home appliance according to claim 6, wherein the controller is configured to determine, from among a plurality of predetermined distance ranges, a distance range that corresponds to the sensed distance between the user's body and the electric home appliance and determine whether to cause the input unit to be in the protruded state or the retreated state based on the determined distance range.

8. The electric home appliance according to claim 1, wherein the controller is configured to determine whether the input unit is touched or pushed based upon determining that the sensing unit is in an abnormal state.

9. The electric home appliance according to claim 8, wherein the controller is configured to cause the input unit to be in the protruded state based upon determining that the input unit is touched or pushed.

10. A control method of an electric home appliance comprising:
sensing, via a sensing unit, whether a user's body is within a predetermined range from the electric home appliance;
calculating a distance between the user's body and the electric home appliance;
causing an input unit configured to receive user input to be in a protruded state or a retreated state based on presence or absence of the user's body within the predetermined range and the calculated distance; and
outputting an optical pattern based on presence or absence of the user's body within the predetermined range.

11. The control method according to claim 10, wherein the input unit is a dial rotatable by the user, and the optical pattern revolves around an edge of a front of the dial, further comprising determining a change speed of the optical pattern based on the calculated distance.

12. The control method according to claim 10, wherein causing the input unit to be in the protruded state or the retreated stated comprises determining, from among a plurality of predetermined distance ranges, a distance range that corresponds to the calculated distance and determining whether to protrude or retreat the input unit based on the determined distance range.

13. The control method according to claim 10, wherein the input unit is a dial rotatable by the user, and the optical pattern revolves around an edge of a front of the dial, further comprising determining a revolving speed of the optical pattern based on the calculated distance.

14. The control method according to claim 10, further comprising determining whether the input unit is touched or pushed based on the sensing unit being in an abnormal state.

15. The control method according to claim 14, further comprising causing the input unit to be in the protruded state based upon determining that the input unit was touched or pushed.

* * * * *